US009981347B2

(12) United States Patent
Pereira et al.

(10) Patent No.: US 9,981,347 B2
(45) Date of Patent: May 29, 2018

(54) INDIUM-TIN-SILVER BASED LEAD FREE SOLDER

(71) Applicant: Antaya Technologies Corporatioin, Warwick, RI (US)

(72) Inventors: John Pereira, Rehoboth, MA (US); Stephen C. Antaya, West Kingston, RI (US)

(73) Assignee: Antaya Technologies Corporation, Warwick, RI (US)

(*) Notice: Subject to any disclaimer, the term of this patent is extended or adjusted under 35 U.S.C. 154(b) by 0 days. days.

(21) Appl. No.: 15/523,861

(22) PCT Filed: May 12, 2016

(86) PCT No.: PCT/US2016/032076
§ 371 (c)(1),
(2) Date: May 2, 2017

(87) PCT Pub. No.: WO2016/186954
PCT Pub. Date: Nov. 24, 2016

(65) Prior Publication Data
US 2017/0368642 A1 Dec. 28, 2017

Related U.S. Application Data

(60) Provisional application No. 62/161,966, filed on May 15, 2015, provisional application No. 62/168,054, filed on May 29, 2015.

(51) Int. Cl.
| H05K 1/09 | (2006.01) |
| C22C 28/00 | (2006.01) |
| C22C 13/00 | (2006.01) |
| B23K 35/26 | (2006.01) |

(52) U.S. Cl.
CPC .............. *B23K 35/26* (2013.01); *C22C 28/00* (2013.01)

(58) Field of Classification Search
CPC .......... B23K 35/26; C22C 28/00; C22C 13/00
USPC ................................. 174/257; 420/555, 557
See application file for complete search history.

(56) References Cited

U.S. PATENT DOCUMENTS

| 5,256,370 A * | 10/1993 | Slattery | B23K 35/262 219/146.22 |
| 5,328,660 A * | 7/1994 | Gonya | B23K 35/262 148/400 |
| 5,580,520 A | 12/1996 | Slattery et al. | |
| 5,874,043 A * | 2/1999 | Sarkhel | B23K 35/262 420/557 |
| 6,010,060 A * | 1/2000 | Sarkhel | B23K 35/262 228/179.1 |
| 6,253,988 B1 * | 7/2001 | Pereira | B23K 35/26 228/122.1 |
| 7,111,771 B2 | 9/2006 | Hua | |

(Continued)

FOREIGN PATENT DOCUMENTS

JP          201209216 A       5/2012

*Primary Examiner* — Sherman Ng
(74) *Attorney, Agent, or Firm* — Robert J. Myers (57) ABSTRACT

Indium-tin-silver alloys suitable for use as a lead free solder are described herein. The alloys may comprise primarily indium or comprise primarily tin. The alloys may further include copper, nickel, and iron or copper, antimony, and zinc. The composition can be used to solder an electrical connector to an electrical contact surface on a glass component. Methods of forming the alloys are also described herein.

20 Claims, 7 Drawing Sheets

(56) References Cited

U.S. PATENT DOCUMENTS

| | | | |
|---|---|---|---|
| 2002/0150787 A1 | 10/2002 | Yoshitome et al. | |
| 2008/0175748 A1* | 7/2008 | Pereira | B23K 1/0008 |
| | | | 420/555 |
| 2012/0222893 A1* | 9/2012 | Hwang | B23K 35/24 |
| | | | 174/257 |
| 2014/0008347 A1* | 1/2014 | Sagawa | B60J 1/02 |
| | | | 219/203 |

* cited by examiner

INDIUM-TIN-SILVER BASED LEAD FREE SOLDER

CROSS-REFERENCE TO RELATED APPLICATION

This application is a national stage application under 35 U.S.C. § 371 of PCT Application Number PCT/US16/32076 having an international filing date of May 12, 2016, which designated the United States, said PCT application claiming the benefit of priority under Article 8 of the Patent Cooperation Treaty of U.S. Provisional Patent Application No. 62/161,966 filed on May 15, 2015 and U.S. Provisional Patent Application No. 62/168,054 filed on May 29, 2015, the entire disclosure of each of which is hereby incorporated by reference.

TECHNICAL FIELD OF THE INVENTION

The invention relates to a solder, in particular to an indium-tin-silver based lead free solder.

BACKGROUND OF THE INVENTION

Windshields and rear windows of vehicles such as automobiles often include electrical devices located within or on the glass. Typically, the electrical devices are antennas or defrosters. In order to provide an electrical connection to such an electrical device, a small area of metallic coating is applied to the glass to make the metalized surface which is electrically connected to the electrical device. An electrical connector for connecting to a lead or the lead itself is then soldered onto the metalized surface. The electrical connector is commonly soldered to the metalized surface of glass with a solder that contains lead (Pb). Due to environmental concerns and/or regulatory mandate in various countries, most industries are currently using or planning to use lead free solders in soldering applications. A common lead free solder employed in some industries contains a high tin (Sn) content, such as more than 80% tin. The lead free solders used on automotive glass as described herein are disclosed in U.S. Pat. No. 6,253,988 issued to John Pereira on Jul. 3, 2001 (hereinafter "Pereira"). Among several lead free solders, Pereira discloses a solder with a weight percentage of 64.35% to 65.65% indium (In), 29.7% to 30.3% tin (Sn), 4.05% to 4.95% silver (Ag), 0.25% to 0.75% copper (Cu) (hereinafter referred to as "65 Indium Solder").

There are difficulties encountered when soldering devices to automotive glass that are not present in other applications. Automotive glass tends to be brittle, and the common high tin, lead free solders that are suitable for use in other applications can typically cause cracking of the automotive glass. Although materials such as ceramics and silicon might appear to be similar in some respects to automotive glass, some solders that are suitable for soldering to ceramic or silicon devices are not suitable for soldering to automotive glass. Soldering two materials with a substantial difference in coefficient of thermal expansion (CTE) between them, such as glass and copper in this case, imposes stress on the solder, either during cooling of the solder joint after formation, or during subsequent temperature excursions. The solder needs to have a melting point (liquidus) that is low enough to not cause cracking of the automotive glass during the soldering process, because a higher melting point and correspondingly higher processing temperature augments the CTE mismatch, imposing higher stress during cooling. The melting point of the solder, however, needs to be high enough not to melt during the normal use of a car, for example, when the car is in the sun with the windows closed or under other extreme harsh environmental conditions. Solders that contain indium, however, normally have much lower melting points than other solders. The 65 Indium Solder, for example, has a solidus temperature of 109° C., compared to a solidus temperature of 160° C. of the lead solder, and a liquidus temperature of 127° C., compared to a liquidus temperature of 224° C. of the lead solder. Some vehicle manufacturers desire that glass products should be capable of surviving elevated temperatures, for example 110° C. for one vehicle manufacturer and 120° C. for another vehicle manufacturer, without any deterioration in performance.

Therefore, there is a need for a lead free solder suitable for use on glass that can withstand higher elevated temperatures than compositions currently available, while delivering all other desired properties for this application sector.

The subject matter discussed in the background section should not be assumed to be prior art merely as a result of its mention in the background section. Similarly, a problem mentioned in the background section or associated with the subject matter of the background section should not be assumed to have been previously recognized in the prior art. The subject matter in the background section merely represents different approaches, which in and of themselves may also be inventions.

BRIEF SUMMARY OF THE INVENTION

In accordance with an embodiment of the invention, an indium-tin-silver based solder is provided. A first embodiment is an alloy suitable for use as a solder having a mixture of elements including about 40% tin by weight, about 0.5% copper by weight, about 50% indium by weight, about 4.5% silver by weight, about 1.8% to about 2.1% nickel by weight, and about 2.9% to about 3.2% iron by weight. The alloy may contain about 1.8% nickel by weight and about 3.2% iron by weight. Alternatively, the alloy may contain about 2.1% nickel by weight and about 2.9% iron by weight.

A second embodiment is an alloy suitable for use as a solder having a mixture of elements including about 14% to about 15% tin by weight, about 1% antimony by weight, about 1% copper by weight, about 5% to about 6% silver by weight, about 1% to about 3% nickel by weight, about 1% zinc by weight, and about 75% indium by weight. The alloy may contain about 14% tin by weight, 5% silver by weight, and about 3% nickel by weight. Alternatively, the alloy may contain about 15% tin by weight, 6% silver by weight, and about 1% nickel by weight.

A third embodiment is an alloy suitable for use as a solder having a mixture of elements including about 75% tin by weight, about 5% silver by weight, and about 20% indium by weight.

A fourth embodiment is an alloy suitable for use as a solder having a mixture of elements including of about 7% tin by weight, about 3% silver by weight, and about 90% indium by weight.

In accordance with another embodiment of the invention, an electrical connection on a glass component is provided. A fifth embodiment is an electrical connection on a glass component including a glass component an electrical contact surface containing silver on the glass component, and an electrical connector soldered to the electrical contact surface on the glass component with a layer of an alloy suitable for use as a solder having a mixture of elements including about 40% tin by weight, about 0.5% copper by weight, about 50% indium by weight; about 4.5% silver by weight, about 1.8% to about 2.1% nickel by weight, and about 2.9% to about 3.2% iron by weight. The alloy may contain about 1.8% nickel by weight and about 3.2% iron by weight. Alternatively, the alloy may contain about 2.1% nickel by weight and about 2.9% iron by weight.

A sixth embodiment is an electrical connection on a glass component that includes a glass component, an electrical contact surface containing silver on the glass component, and an electrical connector soldered to the electrical contact surface on the glass component with a layer of an alloy suitable for use as a solder having a mixture of elements including about 14% to about 15% tin by weight, about 1% antimony by weight, about 1% copper by weight, about 5% to about 6% silver by weight, about 1% to about 3% nickel by weight, about 1% zinc by weight, and about 75% indium by weight. The alloy may contain about 14% tin by weight, 5% silver by weight, and about 3% nickel by weight. Alternatively, the alloy may contain about 15% tin by weight, 6% silver by weight, and about 1% nickel by weight.

A seventh embodiment is an electrical connection on a glass component having a glass component, an electrical contact surface containing silver on the glass component, and an electrical connector soldered to the electrical contact surface on the glass component with a layer of an alloy suitable for use as a solder having a mixture of elements including about 75% tin by weight, about 5% silver by weight, and about 20% indium by weight.

An eighth embodiment is an electrical connection on a glass component which includes a glass component, an electrical contact surface containing silver on the glass component, and an electrical connector soldered to the electrical contact surface on the glass component with a layer of an alloy suitable for use as a solder having a mixture of elements including about 7% tin by weight, about 3% silver by weight, and about 90% indium by weight.

In accordance with yet another embodiment of the invention, a method of forming an indium-tin-silver based solder is provided. A ninth embodiment is a method of forming an alloy suitable for use as a solder by mixing tin, copper, indium, silver, nickel, and iron together to form an alloy. The method includes the steps of adding tin to provide about 40% of the weight of the alloy, adding copper to provide about 0.5% of the weight of the alloy, adding indium to provide about 50% of the weight of the alloy, adding silver to provide about 4.5% of the weight of the alloy, adding nickel to provide about 1.8% to about 2.1% of the weight of the alloy, and adding iron to provide about 2.9% to about 3.2% iron of the weight of the alloy. The steps of adding nickel and adding iron may be accomplished by adding a nickel-iron alloy to provide about 5% of the weight of the alloy, wherein the nickel-iron alloy comprises about 36% to about 42% nickel by weight and about 58% to about 64% iron by weight. The resultant alloy may contain about 1.8% nickel by weight and about 3.2% iron by weight. Alternatively, the resultant alloy may contain about 2.1% nickel by weight and about 2.9% iron by weight.

A tenth embodiment is a method of forming an alloy suitable for use as a solder by mixing tin, antimony, copper, indium, silver, nickel, and zinc together to form an alloy. The method includes the steps of adding tin to provide about 14% to about 15 of the weight of the alloy, adding antimony to provide about 1% of the weight of the alloy, adding copper to provide about 1% of the weight of the alloy, adding silver to provide about 5% to about 6% of the weight of the alloy, adding nickel to provide about 1% to about 3% of the weight of the alloy, adding zinc to provide about 1% of the weight of the alloy, and adding indium to provide about 75% of the weight of the alloy. The resultant alloy may contain about 14% tin by weight, 5% silver by weight, and about 3% nickel by weight. Alternatively, the alloy may contain about 15% tin by weight, 6% silver by weight, and about 1% nickel by weight.

An eleventh embodiment is a method of forming an alloy suitable for use as a solder by mixing tin, indium, and silver together to form an alloy. The method includes the steps of adding tin to provide about 75% of the weight of the alloy, adding silver to provide about 5% of the weight of the alloy, and adding indium to provide about 20% of the weight of the alloy.

A twelfth embodiment is a method of forming an alloy suitable for use as a solder by mixing tin, indium, and silver together to form an alloy. The method includes the steps of adding tin to provide about 7% of the weight of the alloy, adding silver to provide about 3% of the weight of the alloy, and adding indium to provide about 90% of the weight of the alloy.

BRIEF DESCRIPTION OF THE SEVERAL VIEWS OF THE DRAWING

The present invention will now be described, by way of example with reference to the accompanying drawings, in which.

DETAILED DESCRIPTION OF THE INVENTION

Figure 1:
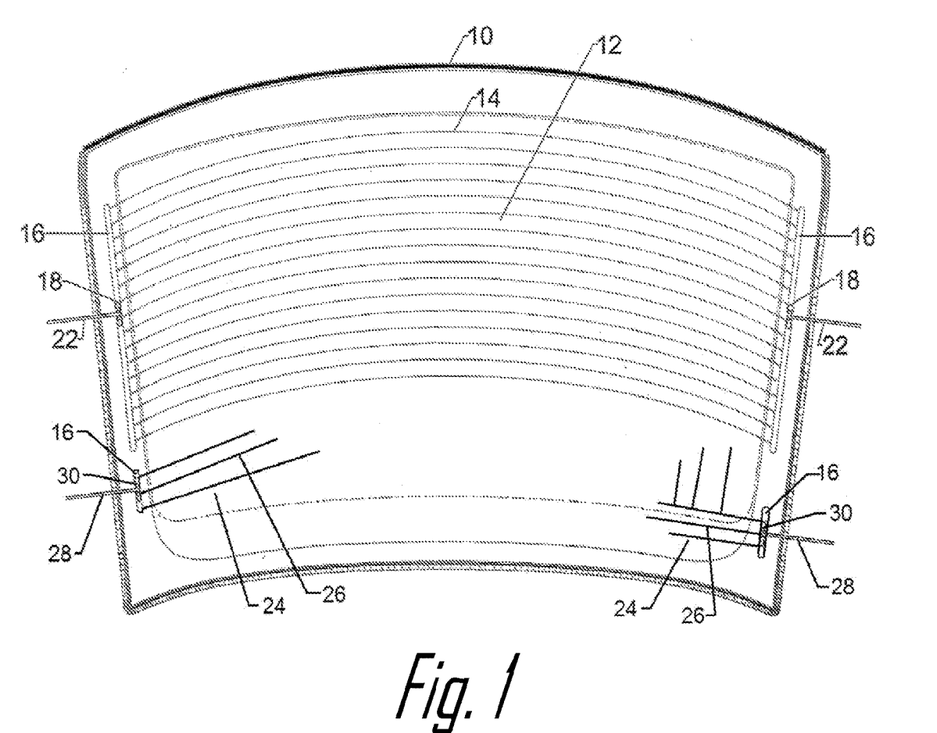
FIG. 1 is an inside view of a rear window of an automobile including an electrically operated defroster according to one embodiment.

The present invention provides a solder composition that is suitable for soldering electrical components to glass for electrically connecting to electrical devices within or on the glass. Referring to FIG. 1, a glass component (10), e.g., a rear window 10 of an automobile (also called a backlight, e.g., in Europe), is employed as a non-limiting illustrative example. The rear window 10 includes a window defroster 12 consisting of electrically resistive defrosting lines 14 embedded within or deposited on the inner surface of the rear window 10. The defrosting lines 14 are electrically connected to a pair of electrical contact strips (electrical contact surfaces, also referred to as buss bars) 16 located on the inner surface of the rear window 10. The electrical contact strips 16 consist of a conductive coating deposited on the inner surface of the rear window 10. Typically, electrical contact strips 16 are formed from silver-containing material.

The rear window 10 may also or alternatively include an antenna 24 used to receive radio signals, e.g. the antenna connected to a radio receiver (not shown), having electrically conductive antenna elements 26 embedded within or deposited on the inner surface of the rear window 10. The antenna elements 26 are electrically connected to a electrical contact strips 16 located on the inner surface of the rear window 10. The electrical contact strips 16 consist of a conductive coating deposited on the inner surface of the rear window 10. Typically, electrical contact strips 16 are formed from silver-containing material.

There are difficulties encountered when soldering devices to automotive glass that are not present in other applications. To address some concerns of the original equipment manufacturers (OEMs) regarding use of non-lead solders on automotive glass, automotive glass suppliers such as CLEPA (European Association of Automotive Suppliers) have developed several tests, including temperature cycling, constant climactic humidity, climactic temperature with humidity, and high temperature storage. To address the concerns of the OEMs over the melting point of the solder, one test included samples of glass soldered to connectors that were stored at 105° C. for 500 hours, during which time weights of 500 grams were hung from each of the connectors, yet no connectors detached from the glass during the test period. The OEMs, such as the European Automobile Manufacturers' Association (ACEA), proposed, however, that temperatures could possibly be as high as 115° C. to 120° C.

Figure 2:
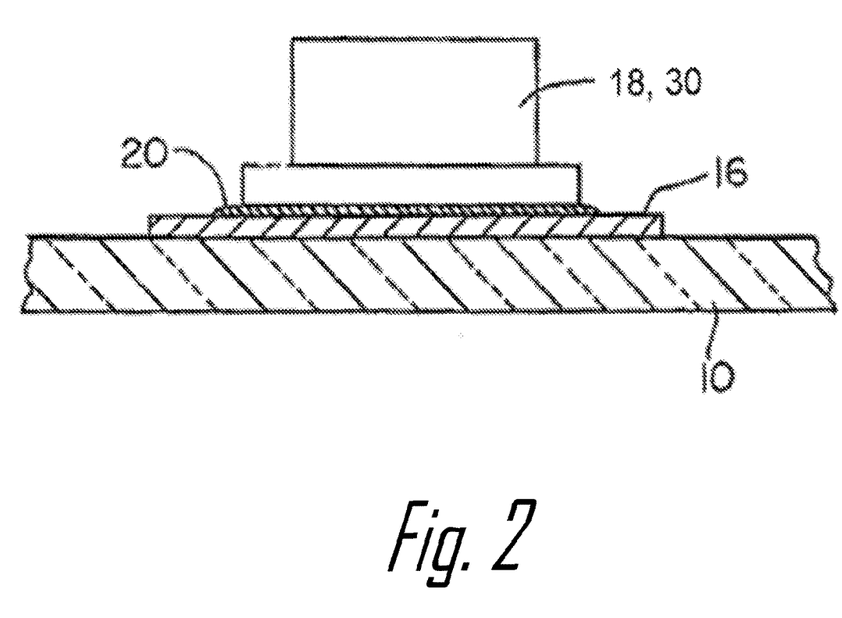
FIG. 2 is a side view of an electrical connector soldered to an electrical contact on the rear window of FIG. 1, with the rear window, electrical contact and solder being shown in section according to one embodiment.

The solder composition of the present invention was developed to address the concerns of the OEMs mentioned supra. Referring to FIG. 2, the layer 20 of solder composition of the present invention is employed to solder power connector 18 or antenna connector 30 to each electrical contact strip 16 on the rear window 10, using standard soldering techniques, such as a resistance soldering device, or flame, micro-flame, hot iron, hot air, and induction heating. Soldering can be conducted in an ambient air atmosphere and does not require an inert gas environment. Power lines 22 can then be electrically connected to the power connector 18 to provide power to window defroster 12 or antenna lines 28 can be electrically connected to the antenna connectors 30 to provide connection between the antenna 24 and the radio receiver (see FIG. 1). Solder performance test and results are provided infra.

A first embodiment of an indium-tin-silver based alloy suitable for use as a solder, hereinafter referred to as Alloy I, is a mixture of elements that includes about 40% tin by weight, about 0.5% copper by weight, about 50% indium by weight, about 4.5% silver by weight, about 1.8% to about 2.1% nickel by weight, and about 2.9% to about 3.2% iron by weight. Alloy I may contain about 1.8% nickel by weight and about 3.2% iron by weight. Alternatively, Alloy I may contain about 2.1% nickel by weight and about 2.9% iron by weight.

As used herein "about X %" may mean that the percentage of an element may vary by ±0.5% by weight for elements comprising less than 25% by weight of the alloy or that the percentage of an element may vary by ±2% by weight for elements comprising more than 25% by weight of the alloy.

Alloy I may also be characterized as a mixture of about 40% tin by weight, about 0.5% copper by weight, about 4.5% silver by weight, and about 5% nickel-iron alloy by weight, wherein the nickel-iron alloy comprises about 36% to about 42% nickel by weight and about 58% to about 64% iron by weight, about 50% indium by weight. According to one particular embodiment, the nickel-iron alloy comprises about 36% nickel by weight and about 64% iron by weight. This particular iron-nickel alloy is commonly known by the trade name INVAR. According to another particular embodiment, the nickel-iron alloy comprises about 42% nickel by weight and about 58% iron by weight. This particular iron-nickel alloy is known by the trade names ALLOY 42 or NILO 42. Alloy I has a solidus temperature of about 109.18° C. and a liquidus temperature of about 115.39° C.

The solidus temperature is practically defined as the temperature at which an alloy begins to melt. Below the solidus temperature, the substance is completely solid, without molten phase. The liquidus temperature is the maximum temperature at which crystals (non-molten metal or alloy) can co-exist with the melt. Above the liquidus temperature, the material is homogeneous, consisting of melt only. The solder processing temperature is higher than the liquidus temperature, by a number of degrees that is determined by the soldering technique.

A second embodiment of an indium-tin-silver based alloy suitable for use as a solder, hereinafter referred to as Alloy II, is a mixture of elements that includes about 14% to about 15% tin by weight, about 1% antimony by weight, about 1% copper by weight, about 5% to about 6% silver by weight, about 1% to about 3% nickel by weight, about 1% zinc by weight, and about 75% indium by weight. Alloy II may contain about 14% tin by weight, 5% silver by weight, and about 3% nickel by weight, hereinafter referred to as Alloy IIA. Alternatively, Alloy II may contain about 15% tin by weight, 6% silver by weight, and about 1% nickel by weight, hereinafter referred to as Alloy IIB. Alloy IIA has a solidus temperature of 122.41° C., and a liquidus temperature of about 135.66° C. Alloy IIB has a solidus temperature of about 123.68° C., and a liquidus temperature of about 138.38° C.

A third embodiment of an indium-tin-silver based alloy suitable for use as a solder, hereinafter referred to as Alloy III, is a mixture of elements that includes about 75% tin by weight, about 5% silver by weight, and about 20% indium by weight. Alloy III has a solidus temperature of about 177.26° C., and a liquidus temperature of about 188.29° C.

A fourth embodiment of an indium-tin-silver based alloy suitable for use as a solder, hereinafter referred to as Alloy IV, is a mixture of elements that includes about 7% tin by weight, about 3% silver by weight, and about 90% indium by weight. Alloy IV has a solidus temperature of about 134.58° C. and a liquidus temperature of about 139.58° C.

Other embodiments of the invention are directed to an electrical connection on a glass component, as shown in FIGS. 1 and 2, that includes a glass component, an electrical contact surface containing silver on the glass component, and an electrical connector soldered to the electrical contact surface on the glass component with a layer of a solder. In four different embodiments of this electrical connection, the solder may be any one of Alloys I, II, III, or IV.

Yet other embodiments of the invention are directed to methods of forming an alloy suitable for use as a solder. According to a first embodiment of this method for forming Alloy I, the method includes the steps of adding tin to provide about 40% of the weight of the alloy, adding copper to provide about 0.5% of the weight of the alloy, adding indium to provide about 50% of the weight of the alloy, adding silver to provide about 4.5% of the weight of the alloy, adding nickel to provide about 1.8% to about 2.1% of the weight of the alloy, and adding iron to provide about 2.9% to about 3.2% iron of the weight of the alloy. In one particular embodiment, Alloy I includes 1.8% nickel by weight and 3.2% iron by weight. In another particular embodiment, Alloy I includes 2.1% nickel by weight and 2.9% iron by weight.

The steps of adding nickel and adding iron may be accomplished by adding a nickel-iron alloy to provide about 5% of the weight of the alloy, wherein the nickel-iron alloy comprises about 36% to about 42% nickel by weight and about 58% to about 64% iron by weight. In one particular embodiment, the nickel-iron alloy includes 36% nickel and 64% iron (INVAR) and in another particular embodiment the nickel-iron alloy includes 42% nickel and 58% iron (ALLOY 42). This provides the benefit of simplifying the process of adding elements to Alloy I by weighing out and adding a single amount of a commercially available nickel-iron alloy rather than separately weighing out and adding a first amount of nickel and a second amount of iron.

According to a second embodiment of this method for forming Alloy II, the method includes the steps of adding tin to provide about 14% to about 15% of the weight of the alloy, adding antimony to provide about 1% of the weight of the alloy, adding copper to provide about 1% of the weight of the alloy, adding silver to provide about 5% to about 6% of the weight of the alloy, adding nickel to provide about 1% to about 3% of the weight of the alloy, adding zinc to provide about 1% of the weight of the alloy, and adding indium to provide about 75% of the weight of the alloy. According to one particular embodiment, Alloy II contains about 14% tin by weight, 5% silver by weight, and about 3% nickel by weight. According to another particular embodiment, Alloy II contains about 15% tin by weight, 6% silver by weight, and about 1% nickel by weight.

According to a third embodiment of this method for forming Alloy III, the method includes the steps of adding tin to provide about 75% of the weight of the alloy, adding silver to provide about 5% of the weight of the alloy, and adding indium to provide about 20% of the weight of the alloy.

According to a fourth embodiment of this method for forming Alloy IV, the method includes the steps of adding tin to provide about 7% of the weight of the alloy, adding silver to provide about 3% of the weight of the alloy, and adding indium to provide about 90% of the weight of the alloy.

Solder Performance Tests and Results
I. Temperature Cycling Test

Figure 3A:
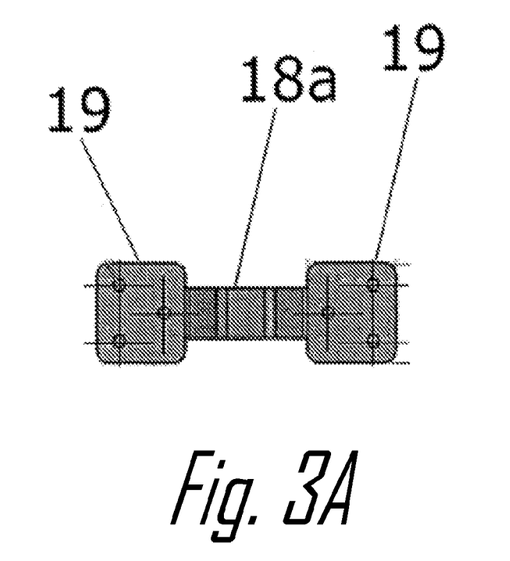
FIGS. 3A and 3B are schematic illustrations of power connectors that can be soldered with solder compositions of the invention according to one embodiment.
Figure 3B:
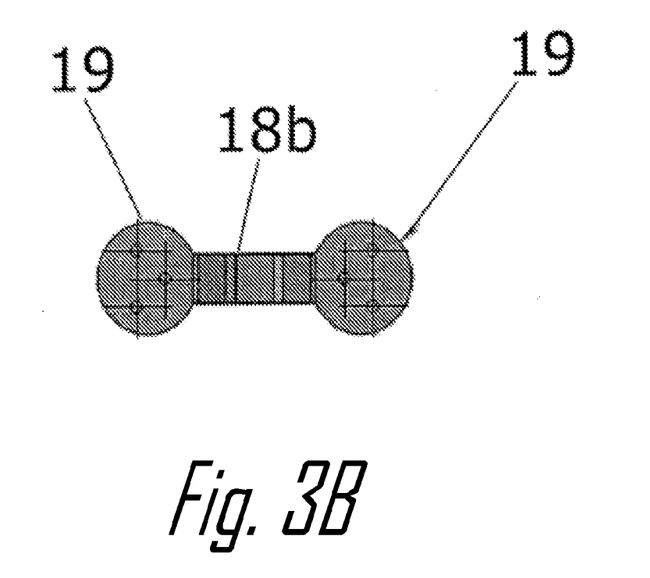
Figure 4:
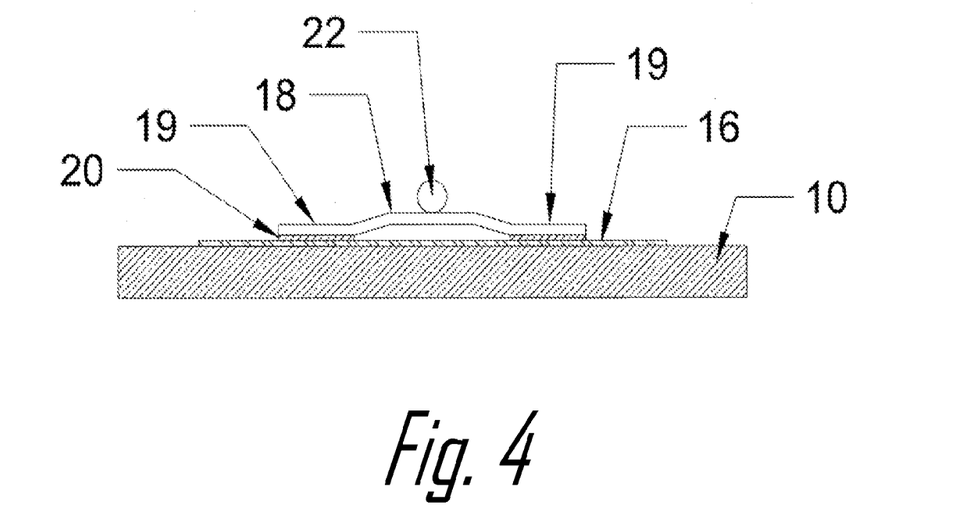
FIG. 4 is a schematic illustration of a power connector soldered onto a windshield with solder compositions of the invention according to one embodiment.

The test samples were glass windshields with power and antenna connectors 18, 30 soldered with Alloy II and Alloy IV. Schematic illustrations of bridge terminal power connectors 18a and 18b, each having a raised elongate bridge portion extending between two spaced apart solder pads 19 on opposite ends, are shown in FIGS. 3A and 3B, respectively. The power connectors 18a and 18b are referred to hereinafter as power connectors 18. The area of each solder pad 19 was about 64 mm$^2$, and, as shown in FIG. 4, the solder composition had a thickness of about 0.5 mm. The power connectors 18 were soldered onto the rear window 10 by rolling the solder ingot into a solder ribbon, reflowing the solder ribbon onto a base copper material in a continuous stripe, skiving the solder stripe to a uniform dimension, stamping and forming the terminal using standard tooling, applying flux to the solder surface, and soldering the power connector 18 to the target area of the electrical contact strip 16 on the rear window 10 using a resistance soldering device, with an energy input in a range of between about 750 watt-seconds and about 1050 watt-seconds, such as about 900 watt-seconds, followed by cooling while the power connector 18 was held in place on the rear window 10 for a time period in a range of between about 8 seconds and about 12 seconds, such as about 10 seconds.

Figure 5:
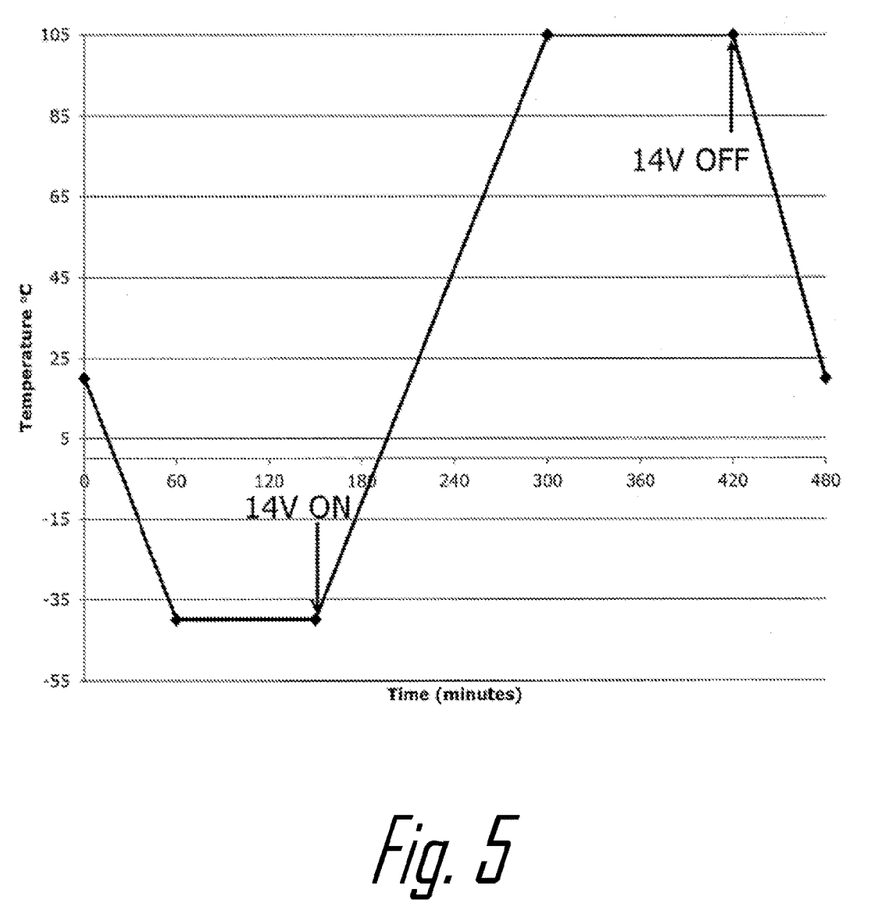
FIG. 5 is a graph of temperature as a function of time during one cycle of a temperature cycling test of embodiments of solder compositions of the invention according to one embodiment.
Figure 6:
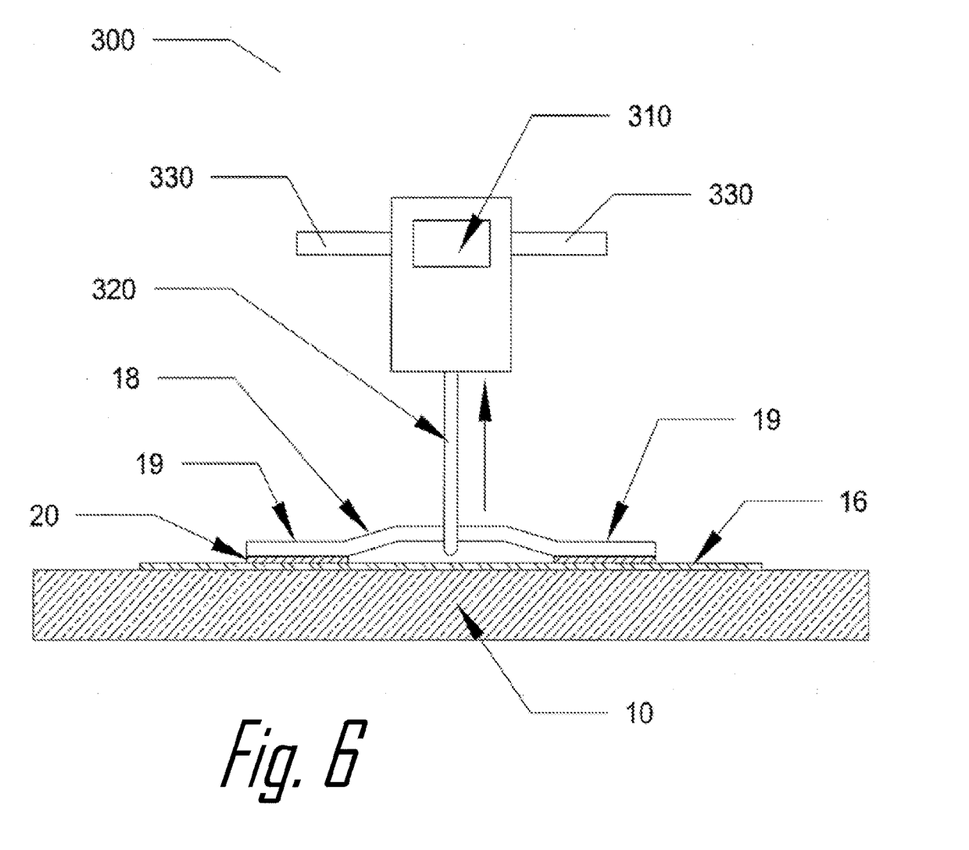
FIG. 6 is a schematic illustration of a pull test employing a force gauge to test the performance of solder compositions of the invention according to one embodiment.

In this test, illustrated in FIG. 5, the temperature of a climate controlled chamber was cycled during a total time of 8 hours from ambient (about 20° C.) to −40° C. and held at −40° C. for 90 minutes, followed by a ramp up to 105° C. for 120 minutes, before returning to ambient temperature, with electrical current loading of 14 V applied through power line 22 starting from the end of the −40° C. step and ending at the end of the 105° C. step, as indicated by the respective arrows shown in FIG. 5. After 20 cycles, each power connector 18 was pulled for 3 seconds in pull test 300 (at ambient temperature), as shown in FIG. 6, in a direction generally normal to the solder layer 20 and the rear window 10, to a force of 50 newtons on a digital force gauge 310 connected by a hook 320 to power connector 18 approximately at the midpoint in between solder pads 19, and manually operated by handles 330. No failures occurred during this test.

II. Heat Soak Test

Figure 7:
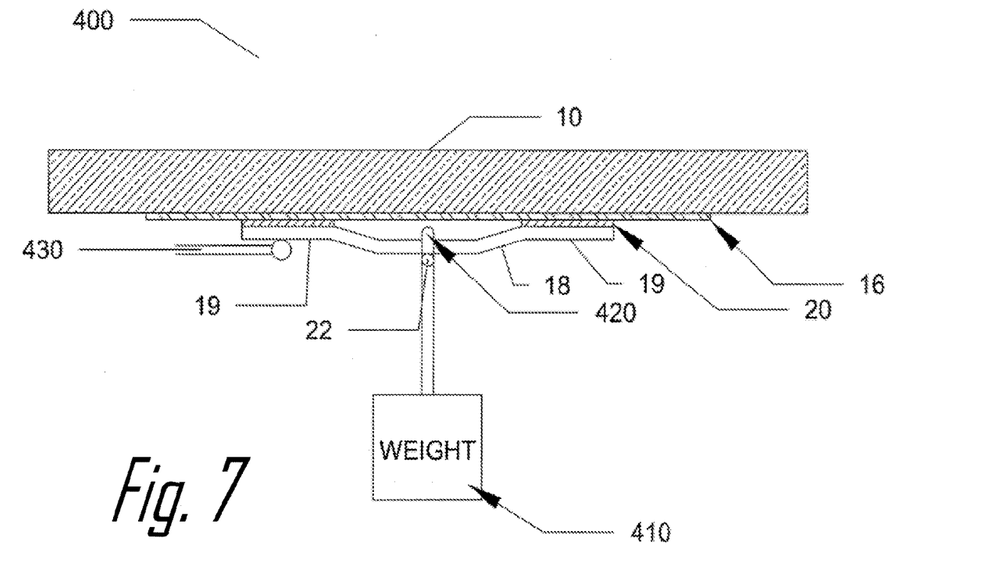
FIG. 7 is a schematic illustration of a pull test employing a weight to test the performance of solder compositions of the invention according to one embodiment.

The test samples were glass windshields with power and antenna connectors 18, 30 soldered with Alloy II and Alloy IV. In this test 400, illustrated in FIG. 7, the temperature of a climate controlled chamber was held at 105° C. for 96 hours, with electrical current loading of 14 V applied for 15 minutes of every hour through power line 22. The power connector 18 was subjected to mechanical loading of 10 newtons in a direction generally normal to the solder layer 20 and the rear window 10 (applied by connecting weight 410 to power connector 18 by hook 420 located approximately at the midpoint in between solder pads 19) directed vertically down as acceleration of gravity during the entire 96 hours. The antenna connector 30 was similarly subjected to mechanical loading of 3 newtons. After the 96 hours test, each power connector 18 was pulled (at ambient temperature) as shown in FIG. 6 and described supra, to a force of 280 to 360 newtons on a digital force gauge for 3 seconds (Mark-10 Long Island, N.Y., Model BG50). No failures of the power connectors 18 occurred during this test. The antenna connectors 18 were similarly tested with a force of 30 to 70 newtons. 10 of 18 antenna connectors 18 soldered with Alloy IV failed.

III. High Temperature Storage Test

The test samples were glass windshields with power and antenna connectors 30, 18 soldered with Alloy II and Alloy IV. In this test, the temperature of a climate controlled chamber (at a relatively dry humidity, but not controlled) was maintained at a constant 120° C. for 24 hours with no electrical or mechanical loading of the power connectors 18. After the end of the 24 hours, each power connector 18 was pulled (at ambient temperature) as shown in FIG. 6 and described supra, to a force of 210 to 290 newtons on a digital force gauge for 3 seconds. The antenna connectors 30 were similarly tested by pulling each antenna connectors 18 with a force of 50 to 75 newtons. No failures of the power or antenna connectors 18, 30 occurred during this test.

IV. Long Term Test with Electrical Load

The test samples were glass windshields with power and antenna connectors 18, 30 soldered with Alloy II. In this test, the temperature of a climate controlled chamber (humidity relatively dry but not controlled) was maintained at a constant 105° C. for 500 hours with electrical current loading of 14 V during the entire 500 hours. After the end of the 500 hours, each power connector 18 was pulled (at ambient temperature) as shown in FIG. 6 and described supra, to a force of 50 newtons on a digital force gauge for 3 seconds. No failures occurred during this test.

V. Heat Shock Test

The test samples were glass windshields with power and antenna connectors 18, 30 soldered with Alloy IV. In this test, a cycle consisted of heating the samples in a climate controlled chamber to 105° C. for one hour with no electrical or mechanical loading, followed by submerging the samples completely in cold water (about 23° C. or lower, from refrigerator). The samples were dried with compressed air after each cycle. After 5 cycles and then after 10 cycles, each power connector 18 was pulled (at ambient temperature) as shown in FIG. 6 and described supra, to a force of 17- to 290 newtons on a digital force gauge for 3 seconds. The antenna connectors 18 were similarly tested to a force of 50 to 80 newtons. No failures occurred during this test.

VI. High Humidity Test: Constant Climate

The test samples were glass windshields with power and antenna connectors 18, 30 soldered with Alloy II. The samples were exposed in an environmental chamber to a constant temperature of 80° C. and a humidity of >96% RH (steam generated) for a total of 504 hours, with electrical current loading on the power connectors 18 of 14 V (drawing about 22 A) for 15 minutes starting at 10 hours after reaching the specified temperature and humidity, and for 15 minutes every 24 hours thereafter until the end of the 504 hours. After the end of the 504 hours, each power connector 18 was pulled (at ambient temperature) as shown in FIG. 6 and described supra, to a force of 50 newtons on a digital force gauge for 3 seconds. No failures occurred during this test.

VII. Resistance to Screen Washer Fluids

The test samples were glass windshields with power and antenna connectors 18, 30 soldered with Alloy II and Alloy IV. In this test, the power and antenna connectors 18, 30 were moistened for 24 hours at 23° C. by a sponge soaked in a simulated windshield washer solution made of 69.5% distilled water, 20% ethanol, 10% isopropanol, 0.5% ethylene glycol, and 0.09% sodium lauryl sulphate. After the end of the 24 hours, each power connector 18 was pulled (at ambient temperature) as shown in FIG. 6 and described supra, to a force of 70 to 310 newtons on a force gauge for 2 seconds. Each antenna connector 30 was similar tested to a force of 60 to 85 newtons. No failures occurred during this test.

VII. Salt Spray Test

The test samples were glass windshields with power and antenna connectors 18, 30 soldered with Alloy II. In this test, the test sample was exposed to a salt spray fog in a test chamber for 96 hours. The salt concentration was at 5% and the pH was between 6.5 and 7.2. The salt fog temperature was set at +35° C.±2° C., and the tower temperature was set at +48° C., with the air pressure being between 16 and 18 psi. After the end of the 96 hours, each power connector 18 was pulled (at ambient temperature) as shown in FIG. 6 and described supra to a force of 50 newtons for 2 seconds. No failures occurred during this test.

The solder composition of the invention is a non-lead alloy that delivers higher service temperature, as well as the mechanical properties with both strength and ductility, and physical properties in wetting and stability as needed for the subject applications, while offering the desired manufacturability. The desired manufacturability includes enabling a low enough process temperature so that manufacturing-prone defects or failures and the silver leaching (scavenging) phenomenon that often occurs in soldering silver-containing metalized electrical contact surfaces can be alleviated or eliminated. This is accomplished by an indium-tin-silver based material or an indium-tin-silver based material that may be metallurgically alloyed or precipitated or dispersed with copper, nickel, and iron or antimony, copper, and zinc.

As used in the instant application, in some embodiments, solder compositions consisting essentially of the listed materials are limited to the specified materials and those that do not materially affect the basic and novel characteristics of the solder compositions and electrical connectors including the solder compositions. The basic and novel characteristics of the solder compositions include the thermal (e.g., liquidus and solidus temperatures) and mechanical (e.g., performance tests described supra) properties described herein.

In addition to providing environmentally friendly lead-free materials, the solder of the invention have many advantages, such as providing a lead-free solder that can be used on automotive glass, delivering necessary mechanical properties in both strength and ductility and withstanding desired elevated service temperatures, while retaining a desired low manufacturing process temperature.

While this invention has been described in terms of the preferred embodiments thereof, it is not intended to be so limited, but rather only to the extent set forth in the claims that follow. Moreover, the use of the terms first, second, etc. does not denote any order of importance, but rather the terms first, second, etc. are used to distinguish one element from another. Furthermore, the use of the terms a, an, etc. do not denote a limitation of quantity, but rather denote the presence of at least one of the referenced items.

We claim:

1. An alloy suitable for use as a solder, comprising:
    about 40% tin by weight;
    about 0.5% copper by weight;
    about 50% indium by weight;
    about 4.5% silver by weight;
    about 1.8% to about 2.1% nickel by weight; and
    about 2.9% to about 3.2% iron by weight.

2. The alloy according to claim 1, wherein the alloy contains about 1.8% nickel by weight and about 3.2% iron by weight.

3. The alloy according to claim 1, wherein the alloy contains about 2.1% nickel by weight and about 2.9% iron by weight.

4. The alloy according to claim 1, wherein the alloy has a solidus temperature of about 109° C. and a liquidus temperature of about 115° C.

5. An electrical connection on a glass component, comprising:
    a glass component;
    an electrical contact surface containing silver on the glass component;
    an electrical connector; and
    a layer of the alloy suitable for use as a solder according to claim 1 intermediate the electrical conductor and the electrical contact surface, thereby attaching the electrical conductor to the electrical contact surface.

6. The electrical connection according to claim 5, wherein the alloy contains about 1.8% nickel by weight and about 3.2% iron by weight.

7. The electrical connection according to claim 5, wherein the alloy contains about 2.1% nickel by weight and about 2.9% iron by weight.

8. An alloy suitable for use as a solder, comprising:
    about 14% to about 15% tin by weight;
    about 1% antimony by weight;
    about 1% copper by weight;
    about 5% to about 6% silver by weight;

about 1% to about 3% nickel by weight;
about 1% zinc by weight; and
about 75% indium by weight.

9. The alloy according to claim 8, wherein the alloy contains about 14% tin by weight, 5% silver by weight, and about 3% nickel by weight.

10. The alloy according to claim 8, wherein the alloy contains about 15% tin by weight, 6% silver by weight, and about 1% nickel by weight.

11. The alloy according to claim 8, wherein the alloy has a solidus temperature in a range of between about 122° C. and about 124° C. and a liquidus temperature in a range of between about 136° C. and about 138° C.

12. An electrical connection on a glass component, comprising:
a glass component;
an electrical contact surface containing silver on the glass component;
an electrical connector; and
a layer of the alloy suitable for use as a solder according to claim 8 intermediate the electrical conductor and the electrical contact surface, thereby attaching the electrical conductor to the electrical contact surface.

13. The electrical connection according to claim 12, wherein the alloy contains about 14% tin by weight, 5% silver by weight, and about 3% nickel by weight.

14. The electrical connection according to claim 12, wherein the alloy contains about 15% tin by weight, 6% silver by weight, and about 1% nickel by weight.

15. An alloy suitable for use as a solder, comprising:
about 75% tin by weight;
about 5% silver by weight; and
about 20% indium by weight.

16. The alloy according to claim 15, wherein the alloy has a solidus temperature of about 177° C. and has a liquidus temperature of about 188° C.

17. An electrical connection on a glass component, comprising:
a glass component;
an electrical contact surface containing silver on the glass component;
an electrical connector; and
a layer of the alloy suitable for use as a solder according to claim 15 intermediate the electrical conductor and the electrical contact surface, thereby attaching the electrical conductor to the electrical contact surface.

18. An alloy suitable for use as a solder, consisting essentially of:
about 7% tin by weight;
about 3% silver by weight; and
about 90% indium by weight.

19. The alloy according to claim 18, wherein the alloy has a solidus temperature of about 135° C. and a liquidus temperature of about 140° C.

20. An electrical connection on a glass component, comprising:
a glass component;
an electrical contact surface containing silver on the glass component;
an electrical connector; and
a layer of an the alloy suitable for use as a solder according to claim 18 intermediate the electrical conductor and the electrical contact surface, thereby attaching the electrical conductor to the electrical contact surface.

* * * * *